United States Patent [19]

Rödel

[11] 4,109,308

[45] Aug. 22, 1978

[54] CIRCUIT FOR CONVERTING A.C. VOLTAGE INTO A D.C. VOLTAGE

[75] Inventor: Günther Georg Rödel, Uhldingen-Muhlhofen, Fed. Rep. of Germany

[73] Assignee: Bodenseewerk Perkin-Elmer & Co., Gmbh, Überlingen, Fed. Rep. of Germany

[21] Appl. No.: 800,165

[22] Filed: May 25, 1977

[30] Foreign Application Priority Data

Jun. 16, 1976 [DE] Fed. Rep. of Germany ....... 2626927

[51] Int. Cl.² ............................................ H02M 7/12
[52] U.S. Cl. ................................... 363/125; 324/119;
328/26; 330/9
[58] Field of Search .................. 324/119, 120; 328/26;
330/9; 363/125, 128

[56] References Cited

U.S. PATENT DOCUMENTS

| 2,877,308 | 3/1959 | Reiner et al. ............................ 330/9 |
| 3,942,095 | 3/1976 | Togneri et al. ................... 324/119 X |
| 4,054,835 | 10/1977 | Los et al. ......................... 324/130 X |

OTHER PUBLICATIONS

A Linear Converter that Converts an Alternating Voltage into a Direct Voltage, R. Danielyan, M. Garibyan, G. Piriyan, Instruments & Experimental Techniques, (Trans of Prib. & Tekh, Eksp. (USSR), vol. 16, #6, pt. 1, pp. 1736-1737, Nov.-Dec. 1973.

Op Amps Form Self-Bussered Rectifier, Jerold Graeme, Electronics, vol. 43, No. 21, p. 98, Oct. 12, 1970.

*Primary Examiner*—William M. Shoop
*Attorney, Agent, or Firm*—Salvatore A. Giarratana; Francis L. Masselle; John D. Crane

[57] ABSTRACT

An a.c. to d.c. converter is disclosed which includes two resetable integrators each for sampling an alternate half-wave of the a.c. voltage to be converted. During each alternate half-wave, when a given integrator is not integrating the input signal, the integrator output is sampled by an analog memory circuit. After the sampling has taken place, the integrator which has been sampled is reset so that it can again operate properly during the succeeding half-wave. The difference of the output for both analog memory circuits is formed so that the d.c. component of the incoming a.c. signal is removed and the remaining residual ripple in the output results only from changes in amplitude of the a.c. signal itself from one-half wave to the next.

10 Claims, 5 Drawing Figures 4,109,308

CIRCUIT FOR CONVERTING A.C. VOLTAGE INTO A D.C. VOLTAGE

BACKGROUND OF THE INVENTION

The invention relates generally to circuits for converting a.c. to d.c. voltage and particularly to a converter which utilizes phase controlled demodulation.

In the field of rectification, it is well known to rectify an a.c. voltage by means of a rectifier circuit composed of diodes. While there are many such diode rectifier circuits, one such circuit which has proved to be quite useful is the so called two way rectifier bridge. Such circuits, however, suffer from the disadvantage that any d.c. component in the input also appears in the output. In addition, these circuits typically use large size capacitors in order to reduce a.c. ripple in the output. Accordingly, when the circuit is first turned on, a time period is required in order to charge the capacitor before full output voltage is achieved. As such, this type of circuit is not suitable for use in instrumentation where the input signal may change rather rapidly with respect to the speed at which the filter capacitors can be either charged or discharged.

One approach to partically overcoming the problem of such bridge rectifier circuits is to use phase controlled rectification which can be accomplished by use of, for example, a ring modulator. In operation, the ring modulator has applied thereto a voltage which is to be converted from a.c. to d.c. In addition, a control voltage of the same frequency either in phase or out of phase is also applied to the ring modulator. The ring modulator operates like a controlled reversing switch so that reversal of the applied voltage during alternate half waves of the control voltage occurs. While this approach has a faster response time than the bridge circuit approach for rectifing an a.c. signal, nevertheless the output has a residual ripple. As with the bridge rectifier, output filtering is generally utilized to eliminate the ripple, however, this again inserts a large time constant into the circuit so that it is no longer capable of responding quickly to changes in the incoming a.c. signal. This aspect of operation for both the bridge circuit and for the ring modulator is disadvantageous in the operation of certain devices.

One particular application in which the above described problems is very disadvantageous is in the measurement of temperature of an object, such as a graphite tube in a flameless atomic absorbtion spectrometer, where the temperature is to be controlled automatically by pirometric means. In such devices, a photoelectric detector may be utilized to provide a substantially sinusoidal a.c. signal which indicates the temperature of the graphite tube. it is desirable to utilize this signal to control the apparatus which heats the tube. Accordingly, any time constant between the a.c. signal and the temperature control signal directly affects the temperature control loop. Accordingly, the prior art rectifiers produce unsatisfactory results.

In view of the foregoing difficulties, it is a primary objective of the invention to provide an a.c. to d.c. converter which produces a very smooth d.c. voltage wherein the circuit itself has a time constant which is small compared to the time constant of prior art a.c. to d.c. converters.

This objective and others for the invention are achieved by the circuit according to the invention wherein the incoming a.c. voltage, which is to be converted to d.c., is applied to two different channels, the first channel being associated with one-half wave of the incoming a.c. signal and the second channel being associated with the other half-wave. Each channel includes a resetable integrator which is coupled to the incoming a.c. signal wherein each integrator is operative during a unique half-wave of the incoming signal. The output of each integrator is coupled to a sampling circuit which is operative during the half cycle when the integrator is not operating. Once the integrator circuit output has been sampled, the integrator is subsequently reset so it will again integrate the incoming a.c. signal during the following half-wave.

The output of each sampling circuit is applied to a differential amplifier so as to produce a difference between the two voltages in the sampling circuits. Since the d.c. component in the input signal appears in the same manner in both sampling circuits, when the difference is formed, the d.c. component is eliminated. The residual ripple in the output results from steps in the a.c. amplitude occuring from one half-wave to the next.

The circuit of the present invention is constructed, according to one embodiment, so that it comprises a first and a second channel. A squarewave voltage in phase with the incoming a.c. voltage is supplied inverted to the first channel and noninverted to the second channel. Each channel of the circuit comprises a first monostable multivibrator, the change-state interval of each being equal to the duration of a half-wave of the incoming a.c. signal. Each channel additionally includes a second monostable multivibrator arranged to be triggered by the leading edge of the output signal from the first monostable multivibrator and having a smaller change-state interval. Additionally, each channel includes a third monostable multivibrator arranged to be triggered by the trailing edge of the output signal from the second monostable multivibrator. The change-state interval of the third monostable multivibrator together with the change-state interval of the second monostable multivibrator is selected so as to have a duration not exceeding a half-wave of the incoming a.c. signal. Each channel additionally includes a first controlled switch which is arranged to be closed by the output of the first monostable multivibrator in that channel so as to apply the incoming a.c. signal to an integrator. In addition, each channel includes a second controlled switch controlled by the output of the second monostable multivibrator in the channel wherein the second controlled switch is operative to gate the output of the channel integrator into a sampling circuit at a time when the integrator is not actively integrating. Each channel additionally includes a third monostable multivibrator circuit which is triggered by the output of the second monostable multivibrator circuit and is operative to control a third switch which resets the integrator. The third switch is operative at a time when the second switch is not operative and the integrator is not actively integrating.

The foregoing and other objects, advantages, and features of the invention are described below in greater detail in connection with the accompanying drawings showing an embodiment of the invention wherein.

DETAILED DESCRIPTION

Figure 1:
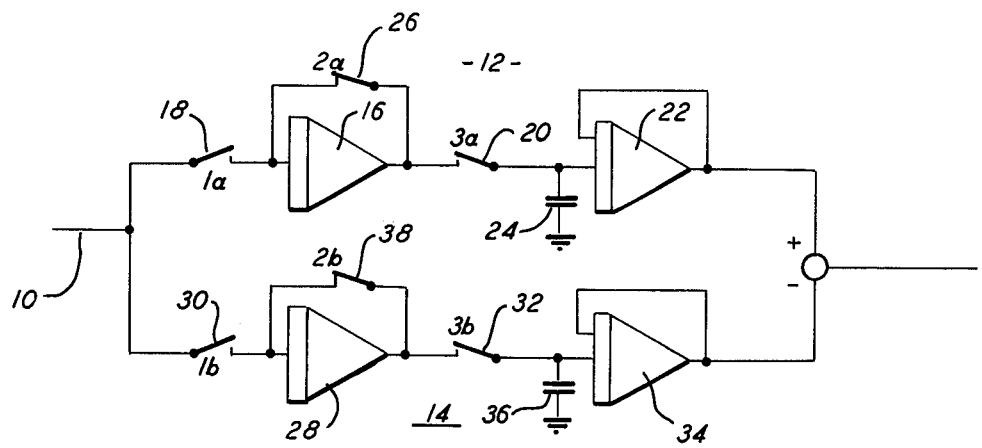
FIG. 1 is a block diagram of the circuit according to the invention.

Referring first to FIG. 1, the input a.c. voltage which is to be converted into a d.c. voltage is applied to an input 10. The input 10 is connected to each of two parallel channels 12 and 14. The first channel 12 includes a integrator 16, a first controlled switch 18 being connected in series with the input of said integrator. The integrator 16 is arranged to be reset by a controlled switch 26 which is coupled between the output and the input of the integrator 16. The output of the integrator 16 is connected to an analog memory circuit (a sample and hold circuit, or, simply a sampling circuit) through a second control switch 20. The analog memory circuit 22 includes a storage capacitor 24.

In a corresponding manner, the second channel includes a integrator 28 which has a first controlled switch 30 connected in series with its input. The integrator 28 is reset by a controlled switch 38 which couples between the output and the input of the integrator 28. The output of the integrator 28 is connected to an analog memory circuit 34 through a controlled switch 32. The analog memory 34 (a sample and hold circuit) includes a storage capacitor 36. The output of each analog memory circuit 22 and 34 is connected in opposition to form the output d.c. voltage of the circuit.

Figure 2:
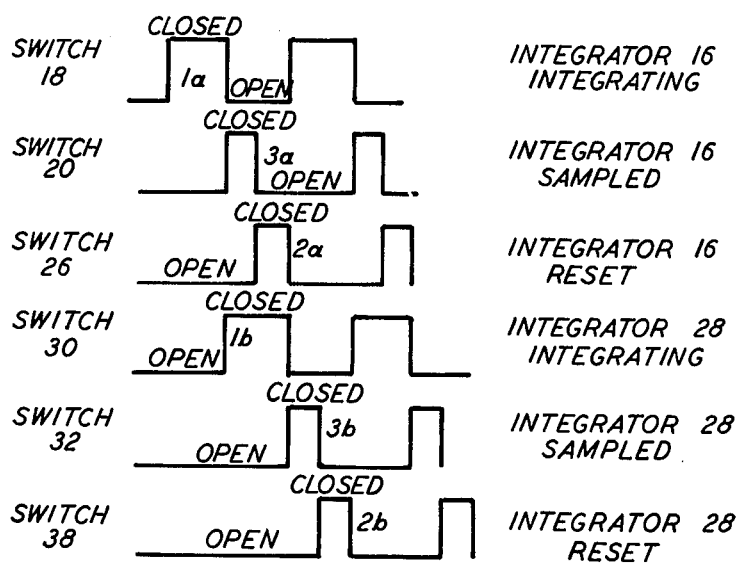
FIG. 2 illustrates the actuation of various switches in FIG. 1 with reference to the incoming a.c. voltage which is to be converted thereby into a d.c. voltage.

In the first line of FIG. 2, an a.c. voltage is shown which illustrates the input a.c. signal which is to be converted into a d.c. voltage proportional thereto. In the second line of FIG. 2, the wave form of a control voltage 1a is illustrated. The control voltage 1a is utilized to close the switch 18 whenever the signal 1a is at an elevated level.

The control voltage 1a is preferably a square wave voltage which is in phase with the a.c. voltage applied to the input 10. This voltage 1a is applied to and closes switch 18 substantially for the duration of its elevated half-wave.

The third line of FIG. 2 illustrates the wave form of a control voltage 3a. The duration of the elevated portion of the pulses for the wave form 3a is smaller than the duration of the second half of the a.c. voltage applied at the input 10.

The fourth line of FIG. 2 illustrates the pulsed wave form of a control voltage 2a. The control voltage 2a has an elevated level which immediately follows an elevated level above the control voltage 3a. The duration of the pulses 3a and 2a together is not larger than the duration of the second half-wave (i.e., the negative half-wave) of the input a.c. voltage. The control voltage 3a controls the second controlled switch 20 which is closed whenever the signal 3a is elevated. The control signal 2a controls the second controlled switch 26 which is closed whenever the signal 2a is elevated. The duration of the elevated portions of the control signal 3a and 2a together have a duration no greater than the duration of the second half of the a.c. voltage input to the circuit. The control voltage 2a controls the switch 26 and causes the integrator 16 to be reset.

The last three lines in FIG. 2 illustrate corresponding signal wave forms of control voltages 1b, 3b and 2b by which the control switches 30, 32 and 38, respectively, are controlled. The pulses of the wave form 1b appear during the negative half wave of the input a.c. voltage the square wave pulses 3b and 2b appear during the subsequent positive half-wave of the a.c. voltage.

In operation, the circuit of FIG. 1 performs as follows.

During the positive half-wave for the input a.c. voltage, switch 18 is closed thereby applying the input a.c. signal to the input of the integrator 16. The switches 20 and 26 are open. The integrator 16 integrates the a.c. voltage over the positive half-wave of the input signal and thus generates a d.c. voltage proportional to the amplitude of the a.c. voltage. At the end of the positive half-wave, the switch 18 is opened and at the same time switch 20 is closed. The d.c. voltage appearing at the output of the integrator 16 is sampled by the memory circuit 22. When this has happened, the switch 20 is opened. Simultaneously, the switch 26 closes whereby the integrator 16 is reset to zero. The storing in channel 1 of the integrator output in the memory circuit 22 and the resetting of the integrator 16 occurs during the negative half of the a.c. voltage.

At the end of the negative half-wave, the integrator 16 is made ready again to form a new sample. The d.c. measured value obtained during the previous sampling is held at the output of the memory circuit 22 and the second channel 14 operates in a similar manner but out of phase thereto. The switch 30 is closed during the negative half-wave of the input a.c. voltage and the integrator 28 operates during this half-wave as well. During the following half-wave, the switch 32 is closed and the integrated measured value is taken from the integrator 28 and stored in the memory circuit 34. Thereafter, the switch 38 is closed to reset the integrator 28 to zero.

The d.c. voltage held by the two memory circuits 22 and 34 have opposite polarity and correspond to the amplitude of the positive and negative half-waves respectively. If the amplitude of the a.c. voltage varies from one half-wave to the next, a corresponding step of the output voltage will occur at the memory circuits.

The output of each memory circuit 22 and 34 is connected in opposition so that the components resulting from the a.c. voltage supplement each other due to their opposite signs. Any part of the voltage levels stored in the memory circuits 22 and 34 which are derived as a result of a d.c. component of the input voltage, however, will cancel with each other.

Figure 3:
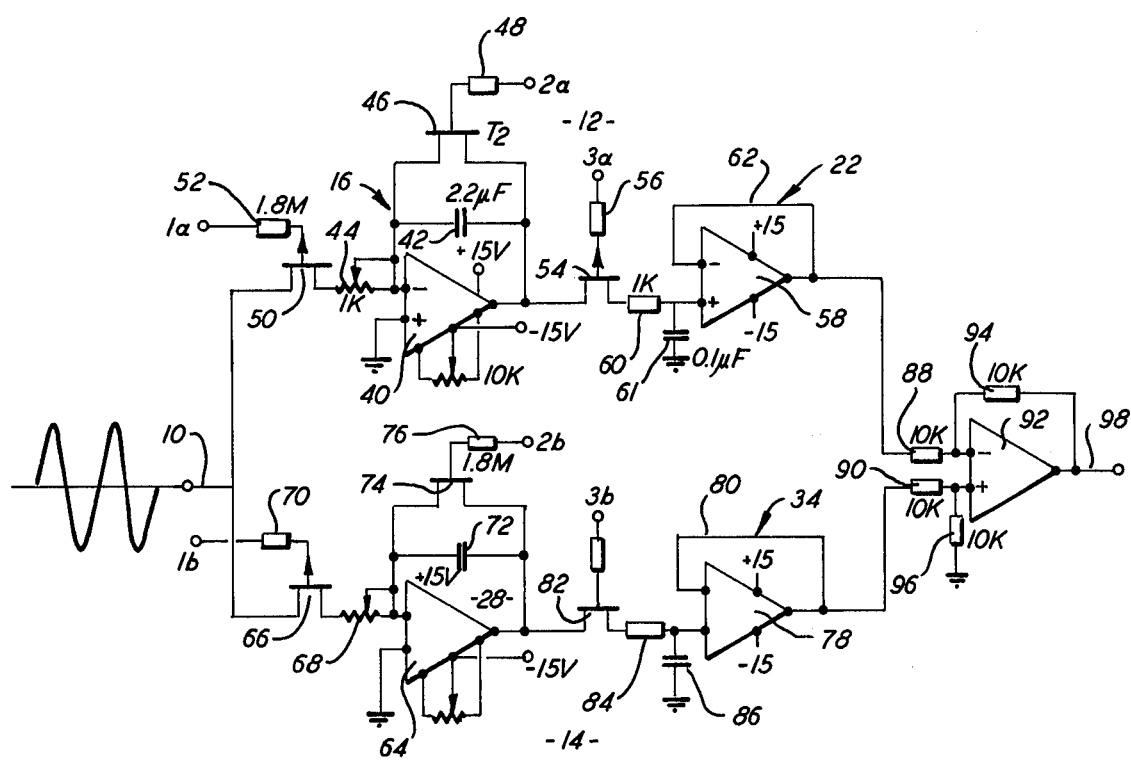
FIG. 3 is a detailed wiring diagram of one implementation of the invention.

Referring now to FIG. 3, the diagram shown therein embodies a more detailed circuit description of the invention. The integrator 16 includes an operational amplifier 40 and a capacitor 42 which is coupled in the negative feedback loop, i.e., the capacitor 42 couples between the output and the inverting input of operational amplifier 40. An adjustable resistor 44 is provided in the input circuit of the operational amplifier 40. The switch 26 is formed by a field effect transistor 46 which is arranged to be controlled by a control voltage 2a (FIG. 2) through a resistor 48. The switch 18 is connected in series with the negative input of the operational amplifier 40 and also includes a field effect transistor 50 which is controlled by the control voltage 1a through an ohmic resistor 52. The switch 20 in the form of a field effect transistor 54 is controlled by the voltage 3a through a resistor 56.

The analog memory circuit 22 comprises an operational amplifier 58, the non-inverting input of which is coupled to the output of the integrator 16 through a resistor 60 and the field effect transistor 54. The output of the operational amplifier 58 is connected to the inverting input thereof through a negative feedback loop 62.

The second channel 14 is designed in a similar manner. The integrator 28 includes an operational amplifier 64. The input 10 is coupled to the inverting input of the operational amplifier 64 through a field effect transistor 66 forming the switch 30 and through an adjustable ohmic resistor 68. The field effect transistor 66 is rendered conductive by the control voltage 1b through a resistor 70. The operational amplifier 64 has a capacitor 72 in its negative feedback loop. A field effect transistor 74 forming the switch 38 is connected in parallel to the capacitor 72 and is rendered conductive by the control voltage 2b through a resistor 76. The memory circuit 34 comprises an operational amplifier 78 the output of which is connected directly to the inverting input of the operational amplifier 78 through a negative feedback loop 80. The non-inverting input of the operational amplifier 78 is coupled to the output of the integrator 28. In addition, a storage capacitor 86 is connected between the non-inverting input of the operational amplifier in ground.

The output of the memory circuits 22 and 34 are respectively coupled through resistors 88 and 90 to two inputs of an operational amplifier 92 which is connected as a differential amplifier. The inverting input of the differential amplifier 92 is coupled to the output through a negative feedback resistor 94. The non-inverting input of the operational amplifier 92 is coupled to ground through a resistor 96 which has exactly the same resistance as the resistor 94. A d.c. voltage appears at the output 98 which is proportional to the amplitude of the a.c. voltage applied to the input 10.

Figure 4:
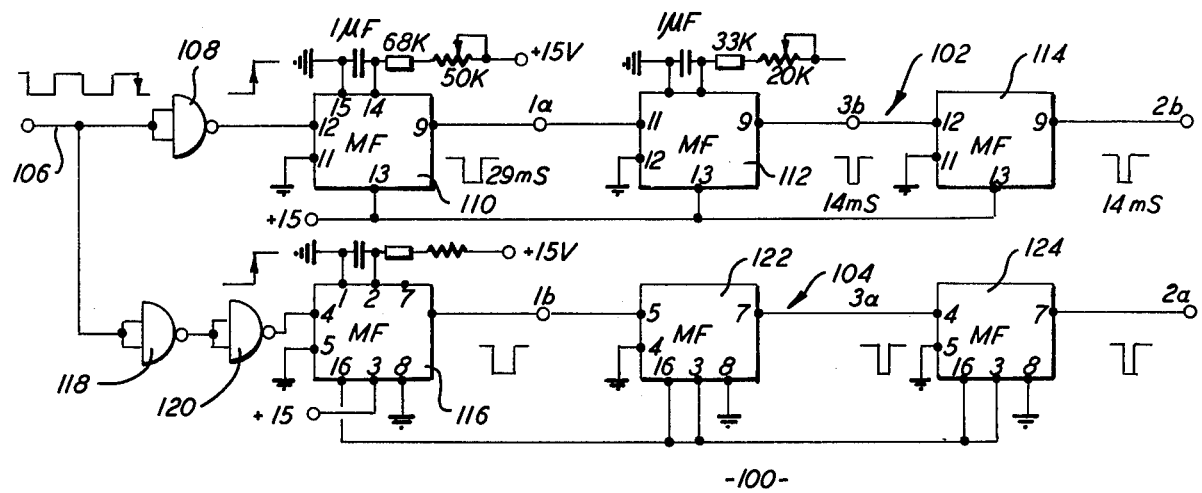
FIG. 4 is a detailed circuit diagram of a control circuit associated with the circuitry of FIG. 3 for generating the control signals for opening and closing the electronic switches therein.

FIG. 4 illustrates the control circuit 100 provided for generating the control voltages shown in FIG. 2. The control circuit, like the circuit in FIG. 3, has two channels 102 and 104. A square wave voltage, which is in phase with the input a.c. voltage is applied to the input 106 of the control circuit. The square wave voltage may be derived from the input a.c. signal by clipping it and amplifying the clipped signal to a level compatable with the control circuit input. The square wave voltage is applied through an inverter 108 to a first monostable multivibrator 110. The change-state interval for the first monostable multivibrator 110 is selected to approximately equal or be slightly shorter than the duration of a half-wave of the a.c. input voltage. The control voltage 1a appears at the output of the monostable multivibrator 110.

The leading edge of the output voltage from the monostable multivibrator 110 triggers a second monostable multivibrator 112. The second monostable multivibrator 112 has a change-state interval which is smaller than the duration of the half-wave of the input a.c. signal and which may, for example, be equal to a quarter period of the a.c. input voltage. The trailing edge of the output voltage from the second monostable multivibrator 112 triggers a third monostable multivibrator 114. The third monostable multivibrator 114 provides an output voltage in the form of a square wave. The change-state intervals of the monostable multivibrators 112 and 114 together are not greater than the duration of a half-wave of the input a.c. voltage. The voltage 3b is derived from the output from the second monostable multivibrator 112 and controls the storing of the intregrated measured value from the integrator 28 in the memory circuit 34 of the second channel. The control voltage 2b is derived from the output of the monostable multivibrator 114 which causes resetting of the integrator 28. Thus the integrated measured value is taken from the integrator 28 which is subsequently reset.

The second channel 104 of the control circuit 100 includes a first monostable multivibrator 116. The square wave voltage from input 106 is applied to the first monostable multivibrator 116 non-inverted through two series connected inverters 118 and 120. Thus, the monostable multivibrator 116 is triggered out of phase with the triggering of monostable multivibrator 110 in the first channel. The change-state interval of the monostable multivibrator 110 is again equal to the duration of a half-wave. The control voltage 1b for controlling the field effect transistor 66 is derived from the output of the monostable multivibrator 116. The second monostable multivibrator 122 of the second channel 104 is triggered by the leading edge of the output voltage of the monostable multivibrator 116. This multivibrator 122 has a change-state interval similar to the change-state interval of the monostable multivibrator 112. The output voltage of the monostable 122 triggers a third monostable multivibrator 124 by its trailing edge. The control voltage 3a is derived from the output of the monostable multivibrator 122, and the control voltage 2a is derived from the output of the monostable multivibrator 124. While the field effect transistor 66 is conducting under the control of the output voltage from the monostable multivibrator 116, the integrator 28 integrates the negative half-wave of the a.c. voltage and the measured value from the previous half-wave is taken from the integrator 16 into the memory circuit 22 and, subsequently, the integrator 16 is reset.

Figure 5:
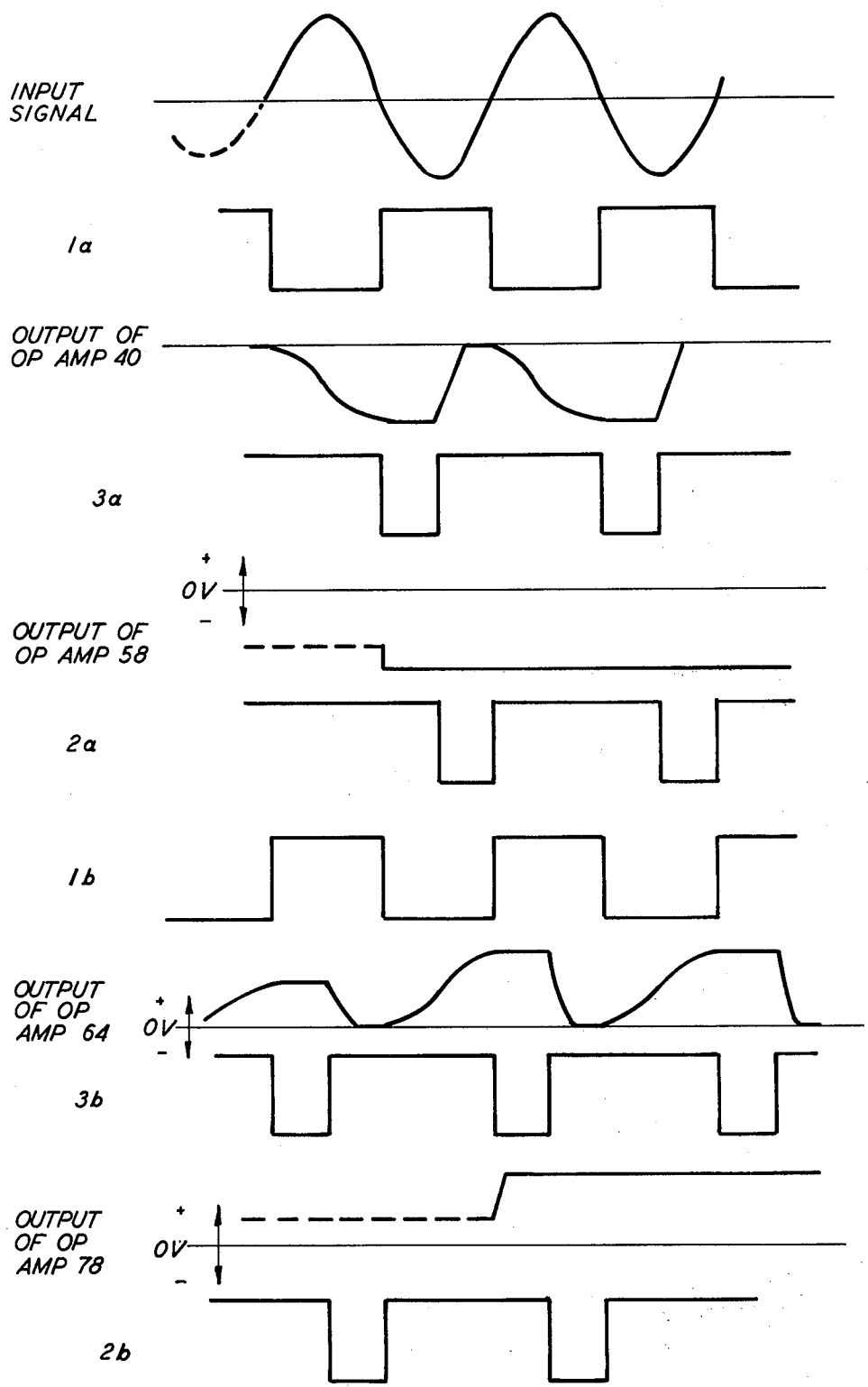
FIG. 5 illustrates various wave forms in the circuit of FIG. 3.

FIG. 5 illustrates various wave forms from the circuits of FIGS. 3 and 4. The first line of FIG. 5 corresponds to the input a.c. voltage appearing at the input 10. The second line illustrates the wave form of the control voltage 1a. The third line of FIG. 5 illustrates the output of operational amplifier 40 (i.e., the output of the integrator) which consists of a negatively increasing signal during the positive half-wave of the input. The increasing rear slope of the wave form 1a occurs when the integrator is reset by the signal 2a. The integrated measured value remains stored in the integrator and this value is stored in the memory circuit by the signal 3a shown in the fourth line of FIG. 5. The voltage at the memory circuit has a wave form which corresponds to the fifth line of FIG. 5. At the end of the pulse 3a, the integrator is reset by the pulse 2a which is shown in the sixth line of FIG. 5. The seventh to the eleventh line of FIG. 5 illustrates the respective wave forms in the second channel of the circuit of FIG. 3.

While the foregoing description has been made with particular emphasis on a preferred embodiment of the invention, those skilled in the art will readily recognize that the circuits can be modified in numerous ways without departing from the spirit and scope of the invention as defined in the following claims.

What is claimed is:

1. A circuit for converting an a.c. voltage into a d.c. voltage comprising, in combination:

a first and second channel respectively associated with alternate half-waves of an applied a.c. voltage to be converted and the other alternate half-waves of the applied a.c. voltage to be converted, each channel comprising:

an integrator circuit with an input and an output;

a first controlled switch coupled between the applied a.c. voltage to be converted and said integrator circuit input for connecting the applied a.c. voltage to be converted to said integrator circuit input during the half-wave of said a.c. voltage associated with the channel in which said integrator circuit is located;

an analog memory circuit for storing an analog signal;

a second controlled switch coupled between said integrator circuit output and said analog memory and operative during a part of the half-wave which the channel is not associated with to connect said integrator circuit output to said memory circuit; and a differential amplifier coupled to each said analog memory to form the d.c. voltage.

2. The circuit of claim 1 additionally including integrator reset means coupled to said integrator circuit in each said channel to reset said integrator circuit following the operation of said second controlled switch during the half-wave which the channel is not associated with.

3. The circuit of claim 2 wherein each said reset means comprises a third controlled switch coupled between one said integrator circuit input and its output to provide a conductive circuit therebetween following operation of said second controlled switch during the half-wave which the channel is not associated with to reset the integrator.

4. The circuit of claim 1 wherein each said integrator circuit comprises an operational amplifier having an output, an inverting input and a non-inverting input, said inverting input comprises said integrator circuit input, a capacitor coupled between said output of said operational amplifier and said inverting input of said operational amplifier.

5. The circuit of claim 1 wherein said analog memory circuit comprises an operational amplifier with an inverting input, a non-inverting input, and an output, said operational amplifier output being connected to said operational amplifier inverting input and said operational amplifier being coupled by said second controlled switch to said integrator circuit output.

6. The circuit of claim 1 wherein said first controlled switch is operated by a square wave signal having the same frequency as the a.c. signal to be converted.

7. A circuit for converting an a.c. voltage into a d.c. voltage comprising, in combination:

a first and a second channel respectively associated with the positive and the negative half-wave of the a.c. voltage to be converted, each channel comprising:

an operational amplifier with and inverting input, a non-inverting input and an output, a capacitor coupled between the output of said operational amplifier and the inverting input of said operational amplifier thereby forming an integrator circuit;

a first controlled switch operable during the half-wave of the a.c. voltage to be converted associated with the channel where said operational amplifier is located to connect the a.c. voltage to be converted to the inverting input of said operational amplifier;

a sampling circuit comprising a second operational amplifier with an output, and inverting input and a non-inverting input with its output coupled to its inverting input and a capacitor coupling the non-inverting input of said second operational amplifier to ground;

a second controlled switch operative after said first controlled switch opens to connect the output of said first mentioned operational amplifier to the non-inverting input to said second operational amplifier;

a third controlled switch operative following the opening of said second controlled switch and prior to closing of said first controlled switch to connect the output of said first mentioned operational amplifier; and said sampling circuit output in each said channel is coupled to a differential amplifier to form a d.c. voltage at the output of said differential amplifier.

8. The circuit of claim 7 additionally including control circuit means operably connected to each said controlled switch means to control their operation in synchronism with said a.c. voltage so that said first controlled switch operates during the half-wave associated with each channel, said second controlled switch being operative during the half-wave the channel is not associated with and said third controlled switch being operative when neither said first or second controlled switch is operative.

9. The circuit of claim 7 wherein each said controlled switch comprises a field effect transistor.

10. The circuit of claim 7 additionally including a control circuit including two control circuit channels, means to provide a square wave in phase with the a.c. voltage to be converted, said square wave being applied to one said control circuit channel and applied inverted to the other said control circuit channel, each said control circuit channel comprising a first monostable multivibrator triggered by the square wave signal applied to the channel, a second monostable multivibrator triggered by the leading edge of the output from said first monostable multivibrator, a third monostable multivibrator triggered by the trailing edge of the output of said second monostable multivibrator, the change of state interval for said second and said third monostable multivibrator together does not exceed the duration of a half-wave of the a.c. voltage to be converted, said first control switch of the first channel being operated by said first monostable multivibrator, said first controlled switch of the second control circuit channel being operated by said first monostable multivibrator of said second control circuit channel, said second controlled switch of said second channel being operated by said second monostable multivibrator of said first control channel, said second controlled switch of said first channel being operated by said second monostable multivibrator of said second control channel, said third controlled switch of said second channel being operated by said third monostable multivibrator of said first control channel and said third controlled switch of said first channel being operated by said third monostable multivibrator of said second control channel.

* * * * *